(12) United States Patent
Malik et al.

(10) Patent No.: US 10,875,965 B2
(45) Date of Patent: Dec. 29, 2020

(54) DIELECTRIC FILM FORMING COMPOSITION

(71) Applicant: Fujifilm Electronic Materials U.S.A., Inc., N. Kingstown, RI (US)

(72) Inventors: Sanjay Malik, Attleboro, MA (US); William A. Reinerth, Riverside, RI (US); Ognian Dimov, Warwick, RI (US); Raj Sakamuri, Sharon, MA (US)

(73) Assignee: Fujifilm Electronic Materials U.S.A., Inc., N, Kingstown, RI (US)

( * ) Notice: Subject to any disclaimer, the term of this patent is extended or adjusted under 35 U.S.C. 154(b) by 0 days.

(21) Appl. No.: 15/907,323

(22) Filed: Feb. 28, 2018

(65) Prior Publication Data

US 2019/0081001 A1 Mar. 14, 2019

Related U.S. Application Data

(60) Provisional application No. 62/556,723, filed on Sep. 11, 2017, provisional application No. 62/581,895, filed on Nov. 6, 2017.

(51) Int. Cl.
*C08G 73/10* (2006.01)
*C08J 5/18* (2006.01)
(Continued)

(52) U.S. Cl.
CPC .... *C08G 73/1085* (2013.01); *C08F 222/1006* (2013.01); *C08F 267/10* (2013.01); *C08G 73/101* (2013.01); *C08G 73/1039* (2013.01); *C08G 73/1067* (2013.01); *C08G 73/1092* (2013.01); *C08J 3/24* (2013.01);
(Continued)

(58) Field of Classification Search
CPC ............... H01L 23/5329; H01L 21/268; H01L 21/31127; H01L 21/32134; H01L 21/6802; H01L 21/76865; H01L 21/76879; H01L 23/5226; H01L 23/53228; C08G 73/1092; C09D 4/06; C09D 179/08
See application file for complete search history.

(56) References Cited

U.S. PATENT DOCUMENTS

| 5,280,013 A | 1/1994 | Newman et al. |
| 5,302,547 A | 4/1994 | Wojnarowski et al. |

(Continued)

FOREIGN PATENT DOCUMENTS

| CN | 106832280 | 6/2017 | ............. C08G 73/10 |
| EP | 1 956 616 | 8/2008 | ............... H01G 4/33 |

OTHER PUBLICATIONS https://www.gelest.com/product/titanium-methacryloxyethylacetoacetate-triisopropoxide-88-in-isopropanol/; copyrigtht 1991; Gelest Inc.*

(Continued)

*Primary Examiner* — Zandra V Smith
*Assistant Examiner* — Andre C Stevenson
(74) *Attorney, Agent, or Firm* — Fish & Richardson P.C.

(57) ABSTRACT

This disclosure relates to dielectric film forming compositions containing a) at least one fully imidized polyimide polymer; b) at least one metal-containing (meth)acrylates; c) at least one catalyst; and d) at least one solvent, as well as related processes and related products. The compositions can form a dielectric film that generates substantially no debris when the dielectric film is patterned by laser ablation process.

42 Claims, 1 Drawing Sheet

Conventional Process

(51) Int. Cl.
| | |
|---|---|
| *G03F 7/038* | (2006.01) |
| *G03F 7/16* | (2006.01) |
| *G03F 7/20* | (2006.01) |
| *G03F 7/38* | (2006.01) |
| *G03F 7/32* | (2006.01) |
| *G03F 7/40* | (2006.01) |
| *H01L 23/373* | (2006.01) |
| *H01L 21/02* | (2006.01) |
| *H01L 21/268* | (2006.01) |
| *H01L 21/311* | (2006.01) |
| *C08J 3/24* | (2006.01) |
| *G03F 7/004* | (2006.01) |
| *G03F 7/037* | (2006.01) |
| *C08F 222/10* | (2006.01) |
| *C09D 7/00* | (2018.01) |
| *G03F 7/025* | (2006.01) |
| *C08F 267/10* | (2006.01) |
| *G03F 7/027* | (2006.01) |
| *C09D 4/06* | (2006.01) |
| *C09D 179/08* | (2006.01) |
| *H01L 21/3213* | (2006.01) |
| *H01L 21/768* | (2006.01) |
| *H01L 23/522* | (2006.01) |
| *H01L 23/532* | (2006.01) |
| *C08K 3/36* | (2006.01) |
| *C08K 5/098* | (2006.01) |

(52) U.S. Cl.
CPC .................................. *C08J 5/18* (2013.01); *C09D 4/06* (2013.01); *C09D 7/00* (2013.01); *C09D 179/08* (2013.01); *G03F 7/0042* (2013.01); *G03F 7/0047* (2013.01); *G03F 7/025* (2013.01); *G03F 7/027* (2013.01); *G03F 7/037* (2013.01); *G03F 7/0387* (2013.01); *G03F 7/162* (2013.01); *G03F 7/168* (2013.01); *G03F 7/2002* (2013.01); *G03F 7/202* (2013.01); *G03F 7/32* (2013.01); *G03F 7/38* (2013.01); *G03F 7/40* (2013.01); *H01L 21/02118* (2013.01); *H01L 21/02282* (2013.01); *H01L 21/268* (2013.01); *H01L 21/311* (2013.01); *H01L 21/31127* (2013.01); *H01L 21/32134* (2013.01); *H01L 21/76802* (2013.01); *H01L 21/76828* (2013.01); *H01L 21/76865* (2013.01); *H01L 21/76871* (2013.01); *H01L 21/76879* (2013.01); *H01L 23/3737* (2013.01); *H01L 23/5226* (2013.01); *H01L 23/53228* (2013.01); *C08J 2379/08* (2013.01); *C08K 3/36* (2013.01); *C08K 5/098* (2013.01); *C08K 2201/005* (2013.01); *H01L 23/5329* (2013.01)

(56) References Cited

U.S. PATENT DOCUMENTS

| | | | |
|---|---|---|---|
| 5,397,863 | A | 3/1995 | Afzali-Ardakani et al. |
| 5,578,697 | A * | 11/1996 | Kawamonzen .... C08G 73/1025 257/E23.077 |
| 6,159,611 | A | 12/2000 | Lee et al. |
| 6,183,588 | B1 | 2/2001 | Kelly et al. |
| 6,323,096 | B1 | 11/2001 | Saia et al. |
| 6,472,082 | B2 | 10/2002 | Kodemura |
| 7,682,972 | B2 | 3/2010 | Hurwitz et al. |
| 7,888,441 | B2 | 2/2011 | Schwab |
| 8,043,526 | B2 | 10/2011 | Lin et al. |
| 9,136,123 | B2 | 9/2015 | Wang et al. |
| 2002/0131247 | A1 | 9/2002 | Cooray |
| 2002/0155216 | A1 | 10/2002 | Reitz et al. |
| 2003/0007332 | A1 | 1/2003 | Seki et al. |
| 2003/0217462 | A1 | 11/2003 | Wang et al. |
| 2005/0040534 | A1 * | 2/2005 | Farnworth ........ H01L 21/02354 257/758 |
| 2006/0118830 | A1 | 6/2006 | Brunner et al. |
| 2006/0199886 | A1 * | 9/2006 | Ryang .................. C01B 25/372 524/262 |
| 2008/0017308 | A1 | 1/2008 | Dershem |
| 2009/0288764 | A1 | 11/2009 | Arrington |
| 2012/0065336 | A1 * | 3/2012 | Mizori ................. C08G 18/672 525/301 |
| 2012/0127578 | A1 * | 5/2012 | Bright ................... G02B 1/116 359/585 |
| 2013/0228901 | A1 | 9/2013 | Dershem et al. |
| 2014/0274470 | A1 * | 9/2014 | Kim .................. A63B 37/0024 473/372 |
| 2016/0090513 | A1 * | 3/2016 | Zhang ................. C09K 3/1463 216/53 |
| 2016/0313642 | A1 | 10/2016 | Malik et al. |
| 2017/0152405 | A1 | 6/2017 | Aoyama et al. |
| 2017/0152408 | A1 | 6/2017 | Kirikae et al. |

OTHER PUBLICATIONS

The International Search Report and Written Opinion of the International Searching Authority for International Application No. PCT/US2018/020102 by Examiner dated Apr. 27, 2018 (10 pages).
The Supplemental European Search Report for European Patent Application No. EP 18 77 3066 by Examiner dated Apr. 1, 2019.
The International Search Report and Written Opinion of the International Searching Authority for International Application No. PCT/US18/20118 by Examiner dated May 15, 2018.
The Supplementary European Search Report for European Application No. EP 18 77 3067 by Examiner dated Jun. 11, 2019.
Stadermann et al., "Fabrication of Large-area Free-standing Ultrathin Polymer Films", Journal of Visualized Experiments, vol. 100, pp. 1-7 (Jun. 3, 2015).

* cited by examiner

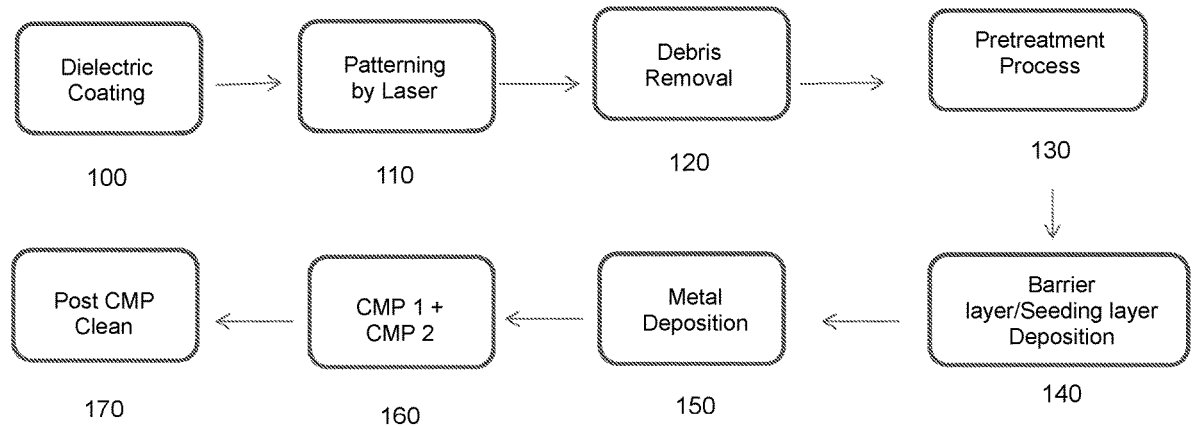
FIG. 1: Conventional Process
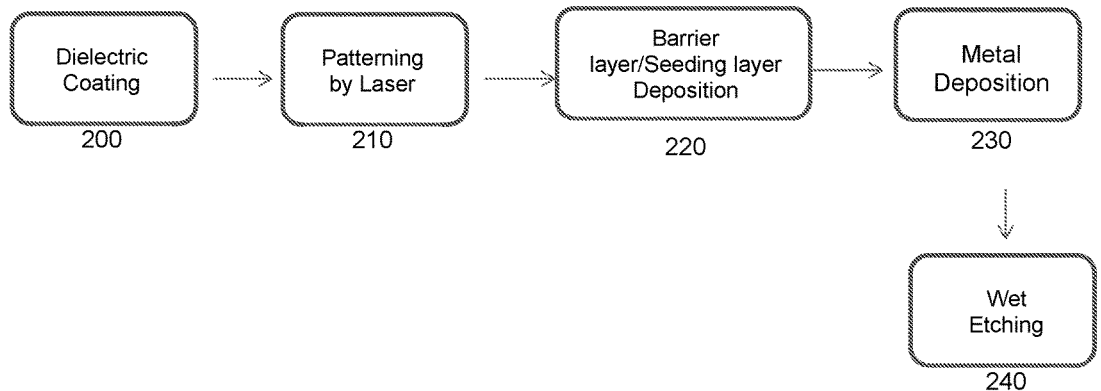
FIG. 2: Exemplary Inventive Process

DIELECTRIC FILM FORMING COMPOSITION

CROSS-REFERENCE TO RELATED APPLICATIONS

The present application claims priority to U.S. Provisional Application Ser. No. 62/581,895, filed on Nov. 6, 2017, and U.S. Provisional Application Ser. No. 62/556,723, filed on Sep. 11, 2017. The prior applications are hereby incorporated by reference in their entirety.

BACKGROUND OF THE DISCLOSURE

The continued expansion of mobile computing applications requires the packing of ever growing levels of computing power in smaller device footprints. Designers of semiconductor devices are relying on the use of a variety of new chip architectures to meet the new device requirements. These new architectures pose significant challenges not only for the designers of new integrated circuits, but also for the designers of the packaging materials that will be used for these devices.

SUMMARY OF THE DISCLOSURE

Dielectric material requirements for packaging applications are continuously evolving as these new, advanced devices are relying heavily on wafer and panel-level packaging (WLP and PLP) and 3D integration. High density interconnect (HDI) architectures consisting of multiple dielectric buildup layers connected through a multistage via structure are being utilized to pack more computing power into smaller spaces. In advanced semiconductor packaging applications, it has become necessary to produce copper interconnect structures with extremely small dimensions and tight pitches (for example 2×2 microns) of the copper traces. Excimer laser ablation of dielectric films is one of the convenient techniques to achieve this level of patterning. However, with conventional dielectric materials, a large amount of debris is formed during the ablation process. Presence of debris can interfere with copper deposition process by preventing uniform seed layer deposition. Therefore, it is essential to remove the ablation debris. Removal of this ablation debris often requires additional cleaning process steps by chemical and/or plasma treatment, which adds to the cost. In order to reduce or eliminate this required cleaning process it would be advantageous to develop a dielectric material that was capable of high resolution patterning while also producing little or no ablation debris. The present disclosure addresses this need through the use of a novel dielectric film-forming composition of this invention.

One embodiment of this disclosure features a novel dielectric film forming composition containing:
  a) at least one fully imidized polyimide polymer;
  b) at least one metal-containing (meth)acrylates;
  c) at least one catalyst; and
  d) at least one solvent.

In some embodiments, this disclosure features a novel dielectric film (e.g., a self-standing film) formed by the composition described herein. In some embodiments, the dielectric film can contain: a) at least one fully imidized polyimide polymer; b) at least one metal-containing (meth) acrylates (e.g., an uncrosslinked metal-containing (meth) acrylate); and c) at least one catalyst. In some embodiments, the dielectric film can includes (e.g., after crosslinking): a) at least one fully imidized polyimide polymer; and b) at least one crosslinked metal-containing (meth)acrylates.

In some embodiments, this disclosure features a process to deposit a conductive metal layer (e.g., creating an embedded copper trace structure) that includes step of:
  a) coating (e.g., by spin coating) the dielectric film forming composition described herein on a substrate to form a dielectric film;
  b) exposing the dielectric film to a source of radiation or heat;
  c) patterning the film to form a patterned dielectric film having openings; and
  d) depositing a conductive metal in at least one opening in the patterned dielectric film.

In some embodiments, the process further includes depositing a seed layer on the patterned dielectric film before depositing the conductive metal.

In some embodiments, this disclosure features a method for preparing a dry film structure. The method includes:
(A) coating a carrier substrate with a dielectric film forming composition described herein;
(B) drying the coated composition to form the dielectric film; and
(C) optionally applying a protective layer to the dielectric film.

BRIEF DESCRIPTION OF DRAWINGS

FIG. 1 is an illustrative scheme of a conventional process for depositing copper on patterned dielectric film.

FIG. 2 is an illustrative scheme of an exemplary inventive process of this disclosure.

DETAILED DESCRIPTION OF THE DISCLOSURE

As used herein, the term "fully imidized" means the polyimide polymers of this disclosure are at least about 90% (e.g., at least about 95%, at least about 98%, at least about 99%, or about 100%) imidized. As used herein, metal-containing (meth)acrylates (MCA) refer to compounds containing a metal and (meth)acrylate ligands. The (meth) acrylate ligands of MCA are sufficiently reactive to enable the MCA to participate in free radical-induced crosslinking of the MCA-containing film. As used herein, the term "(meth)acrylates" include both acrylates and methacrylates. As used herein, the catalyst (e.g., an initiator) is a compound capable of inducing a polymerization or crosslinking reaction when exposed to heat and/or a source of radiation. As used herein, a crosslinker is a compound containing two or more alkenyl or alkynyl groups capable of a crosslinking or polymerization reaction in the presence of a catalyst.

In some embodiments, this disclosure features a dielectric film forming composition containing:
  a) at least one fully imidized polyimide polymer;
  b) at least one metal-containing (meth)acrylates;
  c) at least one catalyst; and
  d) at least one solvent.

In some embodiments, the at least one fully imidized polyimide polymer of the dielectric film forming composition is prepared by reaction of at least one diamine with at least one dicarboxylic acid dianhydride. Examples of suitable diamines include, but are not limited to, 1-(4-aminophenyl)-1,3,3-trimethylindan-5-amine (alternative names including 4,4'-[1,4-phenylene-bis(1-methylethylidene)] bisaniline), 1-(4-aminophenyl)-1,3,3-trimethyl-2H-inden-5-amine, 1-(4-aminophenyl)-1,3,3-trimethyl-indan-5-amine,

[1-(4-aminophenyl)-1,3,3-trimethyl-indan-5-yl]amine, 1-(4-aminophenyl)-2,3-dihydro-1,3,3-trimethyl-1H-inden-5-amine, 5-amino-6-methyl-1-(3'-amino-4'-methylphenyl)-1,3,3-trimethylindan, 4-amino-6-methyl-1-(3'-amino-4'-methylphenyl)-1,3,3-trimethylindan, 5,7-diamino-1,1-dimethylindan, 4,7-diamino-1,1-dimethylindan, 5,7-diamino-1,1,4-trimethylindan, 5,7-diamino-1,1,6-trimethylindan, 5,7-diamino-1,1-dimethyl-4-ethylindan, p-phenylenediamine, m-phenylenediamine, o-phenylenediamine, 3-methyl-1,2-benzene-diamine, 1,2-diaminoethane, 1,3-diaminopropane, 1,4-diaminobutane, 1,5-diaminopentane, 1,6-diaminohexane, 1,7-diaminoheptane, 1,8-diaminooctane, 1,9-diaminononane, 1,10-diaminodecane, 1,2-diaminocyclohexane, 1,4-diaminocyclohexane, 1,3-cyclohexanebis(methylamine), 5-amino-1,3,3-trimethyl cyclohexanemethanamine, 2,5-diaminobenzotrifluoride, 3,5-diaminobenzotrifluoride, 1,3-diamino-2,4,5,6-tetrafluorobenzene, 4,4'-oxydianiline, 3,4'-oxydianiline, 3,3'-oxydianiline, 3,3'-diaminodiphenylsulfone, 4,4'-diaminodiphenylsulfones, 4,4'-isopropylidenedianiline, 4,4'-diaminodiphenylmethane, 2,2-bis(4-aminophenyl)propane, 4,4' diaminodiphenyl propane, 4,4'-diaminodiphenyl sulfide, 4,4'-diaminodiphenylsulfone, 4-aminophenyl-3-aminobenzoate, 2,2'-dimethyl-4,4'-diaminobiphenyl, 3,3'-dimethyl-4,4'-diaminobiphenyl, 2,2'-bis (trifluoromethyl) benzidine, 3,3'-bis (trifluoromethyl) benzidine, 2,2-bis [4-(4-aminophenoxy phenyl)] hexafluoropropane, 2,2-bis (3-amino-4-methylphenyl)-hexafluoropropane, 2,2-bis(3-aminophenyl)-1,1,1,3,3,3-hexafluoropropane, 1,3-bis-(4-aminophenoxy) benzene, 1,3-bis-(3-aminophenoxy)benzene, 1,4-bis-(4-aminophenoxy)benzene, 1,4-bis-(3-aminophenoxy) benzene, 1-(4-aminophenoxy)-3-(3-aminophenoxy) benzene, 2,2'-bis-(4-phenoxyaniline)isopropylidene, bis(p-beta-amino-t-butylphenyl)ether, p-bis-2-(2-methyl-4-aminopentyl)benzene, p-bis(1,1-dimethyl-5-aminopentyl) benzene, 3,3'-dimethyl-4,4'-diaminobiphenyl, 4,4'-diaminobenzophenone, 3'-dichlorobenzidine, 2,2-bis [4-(4-aminophenoxy)phenyl] propane, 4,4'-[1,3-phenylenebis(1-methyl-ethylidene)] bisaniline, 4,4'-[1,4-phenylenebis(1-methyl-ethylidene)]bisaniline, 2,2-bis [4-(4-aminophenoxy) phenyl] sulfone, 2,2-bis [4-(3-aminophenoxy) benzene], 1,4-bis (4-aminophenoxy) benzene, 1,3-bis (4-aminophenoxy) benzene, (1,3'-bis (3-aminophenoxy) benzene, and 9H-fluorene-2,6-diamine. Any of these diamines can be used individually or in combination in any ratio as long as the resulting polyimide polymer satisfies the requirements of this disclosure.

Examples of tetracarboxylic acid dianhydride monomers include, but are not limited to, 1-(3',4'-dicarboxyphenyl)-1,3,3-trimethylindan-5,6-dicarboxylic acid dianhydride, 1-(3',4'-dicarboxyphenyl)-1,3,3-trimethylindan-6,7-dicarboxylic acid dianhydride, 1-(3',4'-dicarboxyphenyl)-3-methylindan-5,6-dicarboxylic acid dianhydride, 1-(3',4'-dicarboxyphenyl)-3-methylindan-6,7-dicarboxylic acid anhydride, pyrazine-2,3,5,6-tetracarboxylic dianhydride, thiophene-2,3,4,5-tetracarboxylic dianhydride, 2,3,5,6-pyridinetetracarboxylic acid dianhydride, norbornane-2,3,5,6-tetracarboxylic acid dianhydride, bicyclo[2.2.2]oct-7-ene-3,4,8,9-tetracarboxylic acid dianhydride, tetracyclo[4.4.1.0$^{2,5}$.0$^{7,10}$]undecane-1,2,3,4-tetracarboxylic acid dianhydride, 3,3',4,4'-benzophenone tetracarboxylic dianhydride, 3,3',4,4'-diphenylsulfone tetracarboxylic dianhydride, 3,3',4,4'-diphenyl ether tetracarboxylic dianhydride, 2,3,3',4'-diphenyl ether tetracarboxylic dianhydride, 2,2-[bis(3,4-dicarboxyphenyl)] hexafluoropropane dianhydride, ethyleneglycol bis (anhydrotrimellitate), and 5-(2,5-dioxotetrahydro)-3-methyl-3-cyclohexene-1,2-dicarboxylic anhydride. More preferred tetracarboxylic acid dianhydride monomers include 2,2-[bis(3, 4-dicarboxyphenyl)] hexafluoropropane dianhydride, 3,3',4,4'-benzophenone tetracarboxylic dianhydride, 3,3',4,4'-diphenylsulfone tetracarboxylic dianhydride, and 3,3',4,4'-diphenyl ether tetracarboxylic dianhydride. Any of these tetracarboxylic acid dianhydride can be used individually or in combination in any ratio as long as the resulting polyimide polymer satisfies the requirements of this disclosure.

In general, the polyimide polymer thus formed can be soluble in an organic solvent. In some embodiments, the polyimide polymer can have a solubility in an organic solvent of at least about 50 mg/mL (e.g., at least about 100 mg/mL or at least about 200 mg/mL) at 25° C. Examples of organic solvents include, but are not limited to, lactones such as gamma-butyrolactone, ε-caprolactone, γ-caprolactone and δ-valerolactone, cycloketones such as cyclopentanone and cyclohexanone, linear ketones such as methyl ethyl ketone (MEK), esters such as n-butyl acetate, ester alcohol such as ethyl lactate, ether alcohols such as tetrahydrofurfuryl alcohol, glycol esters such as propylene glycol methyl ether acetate, and pyrrolidones such as n-methyl pyrrolidone.

In some embodiments, to synthesize the fully imidized polyimide (PI) polymer, a polyimide precursor polymer is prepared first. In some embodiments, the PI precursor polymer is a polyamic acid (PAA) polymer. In some embodiments, the PI precursor is a polyamic ester (PAE) polymer. In some embodiments, one or more diamine(s) are combined with one or more tetracarboxylic acid dianhydride(s) in at least one (e.g., two, three, or more) polymerization solvent to form a polyamic acid (PAA) polymer. In some embodiments, the PAA polymer formed is imidized, either chemically or thermally, to form a PI polymer. In some embodiments, the PAA polymer is end-capped by using an appropriate reagent during or after the polymer synthesis. In some embodiments, the PAA polymer formed is esterified to form a polyamic ester (PAE) polymer. In some embodiments, the PAE polymer is formed by combination of a tetracarboxylic half ester with one or more diamines in at least one polymerization solvent. In some embodiments, the PAE polymer is end-capped by using an appropriate agent. In some embodiments, an end-capped PI polymer is synthesized from a PAA polymer or a PAE polymer containing an end-cap group. In some embodiments, such a PI polymer is end-capped after imidization.

In some embodiments, a chemical imidizing agent (e.g., a dehydrating agent) is added to a PAA polymer to catalyze the ring-closing dehydration process of the polyamic acid groups to form imide functionalities, thereby forming a PI polymer. Examples of suitable dehydrating agents include, but are not limited to, trifluoromethanesulfonic acid, methanesulfonic acid, p-toluenesulfonic acid, ethanesulfonic acid, butanesulfonic acid, perfluorobutanesulfonic acid, acetic anhydride, propionic anhydride, and butyric anhydride. In addition, this dehydration process can be catalyzed by further addition of a basic catalyst. Examples of suitable basic catalysts include, but are not limited to, pyridine, triethylamine, tripropylamine, tributylamine, dicyclohexylmethylamine, 2,6-lutidine, 3,5-lutidine, picoline, 4-dimethylaminopyridine (DMAP) and the like.

Methods to synthesize end-capped and non-endcapped PI precursor polymers and PI polymers are well known to those skilled in the art. Examples of such methods are disclosed in, e.g., U.S. Pat. Nos. 2,731,447, 3,435,002, 3,856,752, 3,983,092, 4,026,876, 4,040,831, 4,579,809, 4,629,777, 4,656,116, 4,960,860, 4,985,529, 5,006,611, 5,122,436, 5,252,534, 5,4789,15, 5,773,559, 5,783,656, 5,969,055, 9,617,386, and US application numbers US20040265731, US20040235992, and US2007083016, the contents of which are hereby incorporated by reference.

The polymerization solvent(s) for preparing PI polymers or their precursors is generally one or a combination of two or more polar, aprotic solvents. Suitable polar, aprotic solvents include, but are not limited to, dimethylformamide (DMF), dimethylacetamide (DMAc), N-formylmorpholine (NFM), N-methylpyrrolidinone (NMP), N-ethylpyrrolidinone (NEP), dimethylsulfoxide (DMSO), gamma-butyrolactone (GBL), hexamethyl phosphoric acid triamide (HMPT), tetrahydrofuran (THF), methyltetrahydrofuran, 1,4-dioxane and mixtures thereof.

In some embodiments, the weight average molecular weight (Mw) of the polyimide polymer described herein is at least about 5,000 Daltons (e.g., at least about 10,000 Daltons, at least about 20,000 Daltons, at least about 25,000 Daltons, at least about 30,000 Daltons, at least about 35,000 Daltons, at least about 40,000 Daltons, or at least about 45,000 Daltons) and/or at most about 100,000 Daltons (e.g., at most about 90,000 Daltons, at most about 80,000 Daltons at most about 70,000 Daltons, at most about 65,000 Daltons, at most about 60,000 Daltons, at most about 55,000 Daltons, or at most about 50,000 Daltons). In some embodiments, the weight average molecular weight (Mw) of the polyimide polymer is from about 20,000 Daltons to about 70,000 Daltons or from about 30,000 Daltons to about 80,000 Daltons. The weight average molecular weight can be obtained by gel permeation chromatography methods and calculated using a polystyrene standard.

In some embodiments, the amount of polyimide (A) is at least about at least about 3 weight % (e.g., at least about 6 weight %, at least about 9 weight %, at least about 12 weight %, or at least about 15 weight %) and/or at most about 40 weight % (e.g., at most about 35 weight %, at most about 30 weight %, at most about 25 weight %, or at most about 20 weight %) of the entire weight of the dielectric film forming composition (including any solvent). In some embodiments, the amount of polyimide (A) is at least about 10 weight % (e.g., at least about 12.5 weight %, at least about 15 weight %, at least about 20 weight %, or at least about 25 weight %) and/or at most about 60 weight % (e.g., at most about 55 weight %, at most about 50 weight %, at most about 45 weight %, at most about 40 weight %, at most about 35 weight %, or at most about 30 weight %) of the amount of solid in the dielectric film forming composition. As used herein, the amount of solid in the dielectric film forming composition refers to the entire weight of the composition minus the amount of solvent in the composition, or the entire weight of the dielectric film formed by the composition.

Metal-containing (meth)acrylates (MCAs) useful in the present disclosure generally have sufficient compatibility with other ingredients in the dielectric film forming composition and are readily dispersed or dissolved in the composition upon mixing. The MCAs may be incorporated into the dielectric film forming composition as a solid or as a solution. In general, the MCA-containing compositions do not form phase separation (becomes visibly heterogeneous) upon standing over the course of at least 24 hours at 25° C. In addition, dielectric films formed from the MCA-containing compositions generally are visibly clear and homogenous.

Suitable metal atoms useful for the MCAs in the present disclosure include titanium, zirconium, hafnium, and germanium. In some embodiments, the MCAs include at least one metal atom and at least one (e.g., one, two, three, or four) (meth)acrylate group. Preferred MCAs contain three or four (meth)acrylate groups attached to each metal atom. Examples of suitable MCAs include, but are not limited to, titanium tetra(meth)acrylate, zirconium tetra(meth)acrylate, hafnium tetra(meth)acrylate, titanium butoxide tri(meth)acrylate, titanium dibutoxide di(meth)acrylate, titanium tributoxide (meth)acrylate, zirconium butoxide tri(meth)acrylate, zirconium dibutoxide di(meth)acrylate, zirconium tributoxide (meth)acrylate, hafnium butoxide tri(meth)acrylate, hafnium dibutoxide di(meth)acrylate, hafnium tributoxide (meth)acrylate, titanium tetra(carboxyethyl (meth)acrylate), zirconium tetra(carboxyethyl (meth)acrylate), hafnium tetra(carboxyethyl (meth)acrylate), titanium butoxide tri(carboxyethyl (meth)acrylate), titanium dibutoxide di(carboxyethyl (meth)acrylate), titanium tributoxide (carboxyethyl (meth)acrylate), zirconium butoxide tri(carboxyethyl (meth)acrylate), zirconium dibutoxide di(carboxyethyl (meth)acrylate), zirconium tributoxide (carboxyethyl (meth)acrylate), hafnium butoxide tri(carboxyethyl (meth)acrylate), hafnium dibutoxide di(carboxyethyl (meth)acrylate), or hafnium tributoxide (carboxyethyl (meth)acrylate). In general, the (meth)acrylate groups of the MCAs are sufficiently reactive to enable the MCAs to participate in crosslinking or polymerization of the MCA-containing film induced by free radicals, which may be generated by one or more catalysts present in the dielectric film forming composition. The crosslinking or polymerization can occur among at least two MCAs or among at least one MCA and at least one non-MCA crosslinker in the dielectric film forming composition. In some embodiments, an MCA is a crosslinker (e.g., when the MCA includes two or more (meth)acrylate groups). In some embodiments, an MCA is a monomer suitable for polymerization or function as a chain terminator (e.g., when the MCA includes only one (meth)acrylate group). In some embodiments, the MCA is not crosslinked (e.g., when the MCA includes only one (meth)acrylate group) in a crosslinked dielectric film formed by the compositions described herein.

In some embodiments, the amount of the at least one MCA is at least about 0.5 weight % (e.g., at least about 1 weight %, at least about 2 weight %, at least about 3 weight %, at least about 4 weight %, or at least about 5 weight %) and/or at most about 20 weight % (e.g., at most about 18 weight %, at most about 16 weight %, at most about 14 weight %, at most about 12 weight %, or at most about 10 weight %) of the entire weight of the dielectric film forming composition. In some embodiments, the amount of the MCA is at least about 1 weight % (e.g., at least about 2 weight %, at least about 4 weight %, at least about 6 weight %, at least about 8 weight %, or at least about 10 weight %) and/or at most about 25 weight % (e.g., at most about 20 weight %, at most about 18 weight %, at most about 16 weight %, at most about 14 weight %, or at most about 12 weight %) of the amount of solid in the dielectric film forming composition.

It was surprisingly observed that the presence of at least one MCA in the dielectric film forming composition can minimize generation of debris when the dielectric film formed by the composition is patterned by using a laser ablation process.

In some embodiments, the dielectric film forming composition of this disclosure can include at least one catalyst (e.g., an initiator). The catalyst is capable of inducing crosslinking or polymerization reaction when exposed to heat and/or source of radiation.

In some embodiments, the catalyst used is a photoinitiator, where the photoinitiator is a compound capable of generating free radicals when exposed to high energy radiation. Non-limiting examples of high energy radiation include electron beams, ultraviolet light, and X-ray. Without wishing to be bound by theory, it is believed that the photoinitiator induces a crosslinking or polymerization reaction involving the (meth)acrylate groups of the MCA compound and/or other entities present in the composition that are capable of undergoing crosslinking or polymerization reaction. Examples of such entities include crosslinkers (e.g., non-MCA crosslinkers) and polyimides bearing alkenyl and alkynyl functional groups.

Specific examples of photoinitiators include, but are not limited to, 1,8-octanedione, 1,8-bis[9-(2-ethylhexyl)-6-nitro-9H-carbazol-3-yl]-1,8-bis(O-acetyloxime), 2-hydroxy-2-methyl-1-phenylpropan-1-one, 1-hydroxycyclohexyl phenyl ketone (Irgacure 184 from BASF), a blend of 1-hydroxycyclohexylphenylketone and benzophenone (Irgacure 500 from BASF), 2,4,4-trimethylpentyl phosphine oxide (Irgacure 1800, 1850, and 1700 from BASF), 2,2-dimethoxyl-2-acetophenone (Irgacure 651 from BASF), bis (2,4,6-trimethyl benzoyl)phenyl phosphine oxide (Irgacure 819 from BASF), 2-methyl-1-[4-(methylthio)phenyl]-2-morphorinopropane-1-on (Irgacure 907 from BASF), (2,4,6-trimethylbenzoyl)diphenyl phosphine oxide (Lucerin TPO from BASF), ethoxy(2,4,6-trimethylbenzoyl)phenyl phosphine oxide (Lucerin TPO-L from BASF), a blend of phosphine oxide, hydroxy ketone and a benzophenone derivative (ESACURE KTO46 from Arkema), 2-hydroxy-2-methyl-1-phenylpropane-1-on (Darocur 1173 from Merck), NCI-831 (ADEKA Corp.), N-1919 (ADEKA Corp.), 2-(benzoyloxy-imino)-1-[4-(phenylthio)phenyl]-1-octanone (OXE-01, available from BASF), 1-(O-acetyloxime)-1-[9-ethyl-6-(2-methylbenzoyl)-9H-carbazol-3-yl]ethanone (OXE-02, available from BASF), benzophenone, 2-chlorothioxanthone, 2-methylthioxanthone, 2-isopropylthioxanthone, benzodimethyl ketal, 1,1,1-trichloroacetophenone, diethoxyacetophenone, m-chloroacetophenone, propiophenone, anthraquinone, dibenzosuberone and the like.

Specific examples of nonionic-type photoinitiators include (5-toluylsulfonyloxyimino-5H-thiophen-2-ylidene)-2-methylphenyl-acetonitrile (Irgacure 121 from BASF), phenacyl p-methylbenzenesulfonate, benzoin p-toluenesulfonate, (p-toluene-sulfonyloxy)methylbenzoin, 3-(p-toluenesulfonyloxy)-2-hydroxy-2-phenyl-1-phenylpropyl ether, N-(p-dodecylbenzenesulfonyloxy)-1,8-naphthalimide, N-(phenyl-sulfonyloxy)-1,8-napthalimide, bis(cyclohexylsulfonyl)diazomethane, 1-p-toluenesulfonyl-1-cyclohexylcarbonyldiazomethane, 2-nitrobenzyl p-toluenesulfonate, 2,6-dinitrobenzyl p-toluenesulfonate, and 2,4-dinitrobenzyl p-trifluoromethylbenzenesulfonate and the like.

In some embodiments, a photosensitizer can be used in the dielectric film forming composition where the photosensitizer can absorb light in the wavelength range of 193 to 405 nm. Examples of photosensitizers include, but are not limited to, 9-methylanthracene, anthracenemethanol, acenaphthylene, thioxanthone, methyl-2-naphthyl ketone, 4-acetylbiphenyl, and 1,2-benzofluorene.

In embodiments where the crosslinking or polymerization reaction is initiated by heat, the catalyst used is a thermal initiator where the thermal initiator is a compound capable of generating free radicals when exposed to a temperature from about 70° C. to about 250° C. Without wishing to be bound by theory, it is believed that the thermal initiator induces a crosslinking or polymerization reaction involving (meth)acrylate groups of the MCA compound and/or other entities present in the composition that are capable of undergoing crosslinking or polymerization reaction. Examples of such entities include crosslinkers (e.g., non-MCA crosslinkers) and polyimides bearing alkenyl and alkynyl functional groups.

Specific examples of thermal initiators include, but are not limited to, benzoyl peroxide, cyclohexanone peroxide, lauroyl peroxide, tert-amyl peroxybenzoate, tert-butyl hydroperoxide, dicumyl peroxide, cumene hydroperoxide, succinic acid peroxide, di(n-propyl)peroxydicarbonate, 2,2-azobis(isobutyronitrile), 2,2-azobis(2,4-dimethylvaleronitrile), dimethyl-2,2-azobisisobutyrate, 4,4-azobis(4-cyanopentanoic acid), azobiscyclohexanecarbonitrile, 2,2-azobis (2-methylbutyronitrile) and the like.

In some embodiments, a combination of two or more catalysts can be used in the dielectric film forming composition. The combination of catalysts can be all thermal initiators, all photoinitiators, or a combination of thermal initiators and photoinitiators.

In some embodiments, the amount of catalyst is at least about 0.25 weight % (e.g., at least about 0.5 weight %, at least about 0.75 weight %, at least about 1.0 weight %, or at least about 1.5 weight %) and/or at most about 4.0 weight % (e.g., at most about 3.5 weight %, at most about 3.0 weight %, at most about 2.5 weight %, or at most about 2.0 weight %) of the entire weight of the dielectric film forming composition. In some embodiments, the amount of catalyst is at least about 0.5 weight % (e.g., at least about 1.0 weight %, at least about 1.5 weight %, at least about 2.0 weight %, or at least about 2.5 weight %) and/or at most about 5.0 weight % (e.g., at most about 4.5 weight %, at most about 4.0 weight %, at most about 3.5 weight %, or at most about 3.0 weight %) of the amount of solid in the dielectric film forming composition.

Suitable examples of organic solvents that can be used in the dielectric film forming composition of this disclosure include, but are not limited to, gamma-butyrolactone (GBL), N-methyl-2-pyrrolidone (NMP), dimethylimidazolidinone, N-methylcaprolactam, N-methylpropionamide, N,N-dimethylacetamide (DMAc), dimethyl sulfoxide (DMSO), N,N-dimethylformamide (DMF), N,N-diethylformamide, diethylacetamide, methyl ethyl ketone (MEK), methyl isobutyl ketone (MIBK), 2-heptanone, cyclopentanone (CP), cyclohexanone, n-butyl acetate (nBA), propylene glycol methyl ether acetate (PGMEA), propylene glycol methyl ether (PGME), ethyl lactate (EL), propyl lactate, 3-methyl-3-methoxybutanol, tetralin, isophorone, ethylene glycol monobutyl ether, diethylene glycol monoethyl ether, diethylene glycol monoethyl ether acetate, diethylene glycol dimethyl ether, diethylene glycol methylethyl ether, triethylene glycol monoethyl ether, dipropylene glycol monomethyl ether, methyl 3-methoxypropionate, ethyl 3-ethoxypropionate, diethyl malonate, ethylene glycol 1,4:3,6-dianhydrosorbitol, n-butyl alcohol, 2,5-dimethyl ether (2,5-dimethylisosorbide), 1,4:3,6-dianhydrosorbitol 2,5-diethyl ether (2,5-diethylisosorbide) and mixtures thereof. In some preferred embodiments, the organic solvent can be gamma-butyrolactone (GBL), cyclopentanone (CP), cyclohexanone, n-butyl alcohol, N-methyl-2-pyrrolidone (NMP), dimethylsulfoxide (DMSO), or a mixture thereof. These solvents can be used individually or in combination as long as it fully dissolves all components of the composition, with the exception of insoluble filler, cast a good film and does not interfere with the combining reaction.

In some embodiments, the amount of the organic solvent in the dielectric film forming composition is at least about 35 weight % (e.g., at least about 40 weight %, at least about 45 weight %, at least about 50 weight %, at least about 55 weight %, at least about 60 weight %, or at least about 65 weight %) and/or at most about 98 weight % (e.g., at most about 95 weight %, at most about 90 weight %, at most about 85 weight %, at most about 80 weight %, at most about 75 weight % or at most about 70 weight %) of the entire weight of the dielectric film forming composition.

In some embodiments, the dielectric film forming composition of this disclosure can further include at least one crosslinker (e.g., a non-MCA crosslinker). In some embodiments, the crosslinker contains two or more alkenyl or alkynyl groups. In general, the crosslinker can be capable of undergoing a crosslinking or polymerization reaction in the presence of a catalyst.

In some embodiments, the at least one crosslinker is at least one urethane acrylate oligomer. The term "urethane acrylate oligomer" refers to a class of urethane (meth) acrylate compounds that contain urethane linkages and have (meth)acrylate (e.g., acrylate or methacrylate) functional groups such as urethane multi(meth)acrylate, multiurethane (meth)acrylate, and multiurethane multi(meth)acrylate. Types of urethane (meth)acrylate oligomers have been described by, for example, Coady et al., U.S. Pat. No. 4,608,409 and by Chisholm et al., U.S. Pat. No. 6,844,950, the contents of which are hereby incorporated by reference. Specific examples of urethane acrylate oligomers useful in the present disclosure include, but are not limited to, CN9165US, CN9167US, CN972, CN9782, CN9783 and CN992. These and other urethane acrylate oligomers are commercially available from Arkema (Sartomer).

In some embodiments, the crosslinker contains at least two (meth)acrylate groups. In some embodiments, the crosslinker is selected from the group consisting of 1,6-hexanediol di(meth)acrylate, tetraethyleneglycol di(meth)acrylate, 1,12-dodecanediol di(meth)acrylate, 1,3-butylene glycol di(meth)acrylate, 1,4-butanediol di(meth)acrylate, cyclohexane dimethanol di(meth)acrylate, polyethylene glycol di(meth)acrylate, propoxylated (3) glycerol tri(meth)acrylate, divinylbenzene, ethoxylated bisphenol-A-di(meth) acrylate, diethylene glycol bis(allyl carbonate), trimethylolpropane tri(meth)acrylate, ditrimethylolpropane tetra(meth) acrylate, pentaerythritol tri(meth)acrylate, pentaerythritol tetra(meth)acrylate, dipentaerythritol penta-/hexa-(meth) acrylate, isocyanurate tri(meth)acrylate, bis(2-hydroxyethyl)-isocyanurate di(meth)acrylate, 1,3-butanediol tri (meth)acrylate, 1,4-butanediol tri(meth)acrylate, neopentyl glycol di(meth)acrylate, (meth)acrylate modified-ureaformaldehyde resins, (meth)acrylate modified melamineformaldehyde resins and (meth)acrylate modified cellulose.

In some embodiments, the amount of the crosslinker in the dielectric film forming composition is at least about 2.5 weight % (e.g., at least about 5 weight %, at least about 7.5 weight %, at least about 10 weight %, at least about 12.5 weight %, or at least about 15 weight %) and/or at most about 30 weight % (e.g., at most about 27.5 weight %, at most about 25 weight %, at most about 22.5 weight %, at most about 20 weight %, or at most about 17.5 weight %) of the entire weight the composition. In some embodiments, the amount of the crosslinker in the dielectric film-forming composition is about 5 weight % (e.g., at least about 10 weight %, at least about 15 weight %, at least about 20 weight %, at least about 25 weight %, or at least about 30 weight %) and/or at most about 60 weight % (e.g., at most about 55 weight %, at most about 50 weight %, at most about 45 weight %, at most about 40 weight %, or at most about 35 weight %) of the amount of solid in the composition. Without wishing to be bound by theory, it is believed that the crosslinker can improve the mechanical properties and chemical resistance of the dielectric film formed by the compositions described herein.

The dielectric film forming composition of this disclosure can optionally include other components such as adhesion promoters, fillers, surfactants, plasticizers, copper passivation reagents, colorants, and dyes.

In some embodiments, the dielectric film forming composition of this disclosure further includes one or more adhesion promoter. Suitable adhesion promoters are described in "Silane Coupling Agent" Edwin P. Plueddemann, 1982 Plenum Press, New York. Classes of adhesion promoters include, but are not limited to, mercaptoalkoxysilanes, aminoalkoxysilanes, epoxyalkoxysilanes, glycidyloxyalkoxysilanes, mercaptosilanes, cyanatosilanes and imidazole silanes. In some embodiments, the adhesion promoter contains both an alkoxsilyl group and a functional group containing carbon-carbon multiple bond selected from substituted or unsubstituted alkenyl groups and substituted or unsubstituted alkynyl groups.

The amount of the optional adhesion promoter in the dielectric film forming composition, if employed, is at least about 0.3 weight % (e.g., at least about 0.5 weight %, at least about 0.7 weight %, or at least about 1 weight %) and/or at most about 4 weight % (e.g., at most about 3 weight %, at most about 2 weight %, or at most about 1.5 weight %) of the entire weight of the composition. In some embodiments, the amount of the optional adhesion promoter in the dielectric film forming composition is at least about 0.5 weight % (e.g., at least about 1 weight %, at least about 2 weight %, or at least about 2.5 weight %) and/or at most about 8 weight % (e.g., at most about 6 weight %, at most about 5 weight %, at most about 4 weight %, or at most about 3 weight %) of the amount of solid in the composition.

In some embodiments, the dielectric film forming composition of this disclosure can further include one or more filler. In some embodiments, the filler is an inorganic particle. In some embodiments, the inorganic particle is selected from the group consisting of silica, alumina, titania, zirconia, hafnium oxide, CdSe, CdS, CdTe, CuO, zinc oxide, lanthanum oxide, niobium oxide, tungsten oxide, strontium oxide, calcium titanium oxide, sodium titanate, barium sulfate, barium titanate, barium zirconate, and potassium niobate. Preferably, the inorganic fillers are in a granular form of an average size of about 0.1-20 microns. In some embodiments, the filler is an organic particle where the organic particle is insoluble in the solvent of the composition. Examples of organic particles include, but are not limited to, cross-linked rubber particles, cross-linked or non-crosslinked polyimide particles, and cross-linked polymer particles.

Silica fillers useful in the present disclosure may be hydrophilic or hydrophobic. Hydrophobic silica fillers can be produced by surface modification of hydrophilic, fumed silica or by direct formation of surface modified silica fillers. Direct formation of surface modified silica fillers is typically accomplished by hydrolytic condensation of functional silanes. Surface modified silica fillers useful in the present disclosure may have reactive and/or non-reactive groups on their surface. Fillers (e.g., silica fillers) useful in the present disclosure have particle sizes (e.g., mean particle sizes) of at most about 2 microns (e.g. at most about 1.5 microns, at most about 1 micron, at most about 0.75 microns, at most about 0.5 microns, at most about 0.25 microns or at most about 0.2 microns) and/or at least about 0.1 microns (e.g., at least about 0.2 microns, at least about 0.3 microns, at least about 0.5 microns, or at least about 1 micron). The filler size distribution can be narrow (e.g., essentially monodisperse)

or broad. The desired filler size and distribution can be achieved by any of a number of techniques known to those skilled in the art including, but not limited to, milling, grinding and filtration. In some embodiments, the silica fillers are dispersed in an organic solvent. Dispersion in a solvent can be accomplished by a variety of methods known to those skilled in the art including, but not limited to, media milling and high shear mixing. Solvents useful for dispersion of silica fillers are not particularly limited. Preferred solvents include esters, ethers, lactones, ketones, amides, and alcohols. More preferred solvents include GBL, cyclopentanone, cyclohexanone, ethyl lactate, and n-butanol.

In some embodiments, the amount of the filler (e.g., silica filler) in the dielectric film forming composition of this disclosure, if employed, is at least about 2 weight % (e.g., at least about 4 weight %, at least about 6 weight %, at least about 8 weight %, or at least about 10 weight %) and/or at most about 20 weight % (e.g., at most about 18 weight %, at most about 15 weight %, or at most about 12 weight %) of the entire weight of the composition. In some embodiments, the amount of the filler (e.g., silica filler) in the dielectric film forming composition of this disclosure is at least about 5 weight % (e.g., at least about 10 weight %, at least about 14 weight %, at least about 17 weight %, or at least about 20 weight %) and/or at most about 40 weight % (e.g., at most about 35 weight %, at most about 30 weight %, or at most about 25 weight %) of the amount of solid in the composition.

The dielectric film forming composition of this disclosure can also optionally contain one or more surfactant. If a surfactant is employed, the amount of the surfactant is at least about 0.001 weight % (e.g., at least about 0.01 weight % or at least about 0.1 weight %) and/or at most about 2 weight % (e.g., at most about 1 weight % or at most about 0.5 weight %) of the entire weight of the dielectric film forming composition. In some embodiments, the amount of the surfactant is at least about 0.002 weight % (e.g., at least about 0.02 weight % or at least about 0.2 weight %) and/or at most about 4 weight % (e.g., at most about 1 weight % or at most about 0.5 weight %) of the amount of solid in the composition. Examples of suitable surfactants include, but are not limited to, the surfactants described in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988.

The dielectric film forming composition of the present disclosure can optionally contain one or more plasticizers. The amount of the optional plasticizer, if employed, is at least about 1 weight % (e.g., at least about 2 weight % or at least about 3 weight %) and/or at most about 10 weight % (e.g., at most about 7.5 weight % or at most about 5 weight %) of the entire weight of the dielectric film forming composition. In some embodiments, the amount of the optional plasticizer is at least about 2 weight % (e.g., at least about 4 weight % or at least about 6 weight %) and/or at most about 20 weight % (e.g., at most about 14 weight % or at most about 10 weight %) of the amount of solid in the composition.

The dielectric film forming composition of the present disclosure can optionally contain one or more copper passivation reagent. Examples of copper passivation reagents include triazole compounds, imidazole compounds and tetrazole compounds. Triazole compounds can include triazoles, benzotriazoles, substituted triazoles, and substituted benzotriazoles. Examples of substituents include $C_1$-$C_8$ alkyl, amino, thiol, mercapto, imino, carboxy and nitro groups. Specific examples of triazole compounds include benzotriazole, 1,2,4-triazole, 1,2,3-triazole, tolyltriazole, 5-methyl-1,2,4-triazole, 5-phenyl-benzotriazole, 5-nitrobenzotriazole, 3-amino-5-mercapto-1,2,4-triazole, 1-amino-1,2,4-triazole, hydroxybenzotriazole, 2-(5-amino-pentyl)-benzotriazole, 1-amino-1,2,3-triazole, 1-amino-5-methyl-1,2,3-triazole, 3-amino-1,2,4-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, and the like. Examples of imidazole compounds include, but are not limited to, 2-alkyl-4-methyl imidazole, 2-phenyl-4-alkyl imidazole, 2-methyl-4(5)-nitro-imidazole, 5-methyl-4-nitroimidazole, 4-imidazolemethanol hydrochloride, 2-mercapto-1-methylimidazole. Examples of tetrazole compounds include, but are not limited to, 1-H-tetrazole, 5-methyl-1H-tetrazole, 5-phenyl-1H-tetrazole, 5-amino-1H-tetrazole, 1-phenyl-5-mercapto-1H-tetrazole, 5,5'-bis-1H-tetrazole, 1-methyl-5-ethyltetrazole, 1-methyl-5-mercaptotetrazole, 1-carboxymethyl-5-mercaptotetrazole, and the like.

In some embodiments, the amount of the optional copper passivation agent, if employed, is at least about 0.01 weight % (e.g. at least about 0.05 weight % at least about 0.1 weight % or at least about 0.5 weight %) and/or at most about 2 weight % (e.g., at most about 1.5 weight % or at most about 1 weight %) of the entire weight of the dielectric film forming composition. In some embodiments, the amount of the optional copper passivation agent is at least about 0.02 weight % (e.g., at least about 0.1 weight %, at least about 0.2 weight % or at least about 1 weight %) and/or at most about 4 weight % (e.g., at most about 3 weight % or at most about 2 weight %) of the amount of solid in the composition.

The dielectric film forming composition of the present disclosure can optionally contain one or more dyes and/or one or more colorants.

In some embodiments, the polyimide can be prepared from diamines excluding the siloxane diamine of Structure (1)

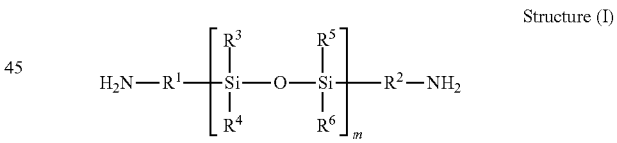

Structure (I)

in which $R^1$ and $R^2$ are each independently a divalent aliphatic or aromatic group (e.g., a $C_{1-6}$ divalent aliphatic group or a $C_{6-12}$ divalent aromatic group), $R^3$, $R^4$, $R^5$ and $R^6$ are each independently a monovalent aliphatic or aromatic group (e.g., a $C_{1-6}$ monovalent aliphatic group or a $C_{6-12}$ monovalent aromatic group), and m is an integer of 1-100.

Examples of monomer of siloxane diamines of structure (III) include, but are not limited to:

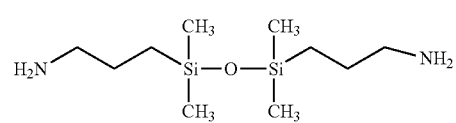

-continued

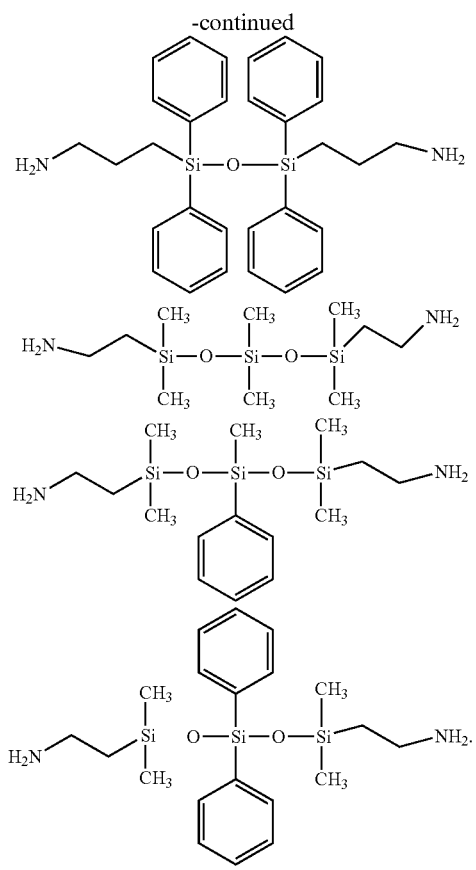

In some embodiments, the dielectric film forming compositions of the present disclosure may specifically exclude one or more of the following solvents, in any combination, if more than one. Such solvents can be selected from the group consisting of linear ketones such as methyl ethyl ketone (MEK), esters such as ethyl acetate, ester alcohols such as ethyl lactate, ether alcohols such as tetrahydrofurfuryl alcohol, and glycol esters such as propylene glycol methyl ether acetate (PGMEA).

In some embodiments, the dielectric film forming compositions of the present disclosure may specifically exclude one or more of the following adhesion promoters, in any combination, if more than one. Such adhesion promoters can be selected from the group consisting of primary amine containing adhesion promoters (such as 3-aminopropyl triethoxysilane and m-aminophenyl triethoxysilane), secondary amine containing adhesion promoters (such as N-cyclohexylamino trimethoxysilane), tertiary amine containing adhesion promoters (such as diethylaminoethyl triethoxysilane), urea containing adhesion promoters (such as ureidopropyl trimethoxysilane), anhydride containing adhesion promoters (such as 3-(triethoxysilyl)propyl succinic anhydride), epoxy containing adhesion promoters (such as 2-(3, 4-epoxycyclohexyl)ethyl triethoxysilane), isocyanato containing adhesion promoters (such as 3-isocyanatopropyltriethoxy silane), and sulfur containing adhesion promoters (such as 3-mercaptopropyl trimethoxysilane).

In some embodiments, the dielectric film forming compositions of the present disclosure may specifically exclude one or more of additive components, in any combination, if more than one. Such components can be selected from the group consisting of non-polyimide polymers, non-crosslinking non-polyimide polymers, surfactants, plasticizers, colorants, dyes, water, oxygen scavengers, quaternary ammonium hydroxides, amines, alkali metal and alkaline earth bases (such as NaOH, KOH, LiOH, magnesium hydroxide, and calcium hydroxide), fluoride containing monomeric compounds, oxidizing agents (e.g., peroxides, hydrogen peroxide, ferric nitrate, potassium iodate, potassium permanganate, nitric acid, ammonium chlorite, ammonium chlorate, ammonium iodate, ammonium perborate, ammonium perchlorate, ammonium periodate, ammonium persulfate, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, urea hydrogen peroxide, and peracetic acid), abrasives, silicates, corrosion inhibitors (e.g., non-azole corrosion inhibitors), guanidine, guanidine salts, inorganic acids (e.g., sulfonic acids, sulfuric acid, sulfurous acid, nitrous acid, nitric acid, phosphorous acid, and phosphoric acid), organic acids (e.g., hydroxycarboxylic acids and carboxylic and polycarboxylic acids), pyrrolidone, polyvinyl pyrrolidone, and metal halides.

Without wishing to be bound by theory, it is believed that the dielectric film forming composition of the present disclosure can minimize generation of debris when the dielectric film formed by the composition is patterned by using a laser ablation process. As such, when such a composition is used in a process of forming a conductive metal layer (e.g., a copper layer) on a semiconductor substrate, the process does not require a debris removal process or a pretreatment process before coating a seed layer (e.g., including a barrier layer and a metal seeding layer).

In some embodiments, this disclosure features a dielectric film formed by the dielectric film forming composition described herein. In some embodiments, when the dielectric film is not yet crosslinked by exposing to a source of radiation or heat, the dielectric film can include: a) at least one fully imidized polyimide polymer; b) at least one metal-containing (meth)acrylates; and c) at least one catalyst. In some embodiments, the dielectric film can further include at least one crosslinker (such as those described above with respect to the dielectric film forming composition).

In some embodiments, when the dielectric film has been crosslinked by exposing to a source of radiation or heat, the dielectric film can include a) at least one fully imidized polyimide polymer; b) at least one crosslinked metal-containing (meth)acrylate; and c) optionally at least one inorganic filler. In such embodiments, the at least one fully imidized polyimide polymer can be uncrosslinked, or can be crosslinked (e.g., when the polymer has at least one crosslinking group) with itself or with the metal-containing (meth)acrylate).

In some embodiments, the optical absorbance of the dielectric film of this disclosure at wavelength of 308 nm, 355 nm, 365 nm, or 405 nm is at least about 0.1 $\mu m^{-1}$ (e.g., at least about 0.5 $\mu m^{-1}$, at least about 1 $\mu m^{-1}$, at least about 2 $\mu m^{-1}$, at least about 3 $\mu m^{-1}$, at least about 5 $\mu m^{-1}$, at least about 7 $\mu m^{-1}$, or at least about 9 $\mu m^{-1}$).

In some embodiments, this disclosure features a method of preparing a dry film structure. The method includes:
(A) coating a carrier substrate with a dielectric film forming composition described herein (e.g., a composition containing: a) at least one fully imidized polyimide polymer; b) at least one metal-containing (meth)

acrylate; c) at least one catalyst; d) at least one solvent, and e) optionally at least one crosslinker to form a coated composition;
(B) drying the coated composition to form a dielectric film; and
(C) optionally applying a protective layer to the dielectric film. In some embodiments, the carrier substrate has excellent optical transparency and it is substantially transparent to actinic irradiation used to form a relief pattern in the polymer layer. The thickness of the carrier substrate is preferably in the range of at least about 10 µm (e.g., at least about 15 µm, at least about 20 µm, at least about 30 µm, at least about 40 µm, at least about 50 µm or at least about 60 µm) to at most about 150 µm (e.g., at most about 140 µm, at most about 120 µm, at most about 100 µm, at most about 90 µm, at most about 80 µm, or at most about 70 µm).

In some embodiments, the carrier substrate is a single or multiple layer film, which can include one or more polymers (e.g., polyethylene terephthalate). In some embodiments, the protective layer substrate is a single or multiple layer film, which can include one or more polymers (e.g., polyethylene or polypropylene). Examples of carrier substrates and protective layers have been described in, e.g., U.S. Application Publication No. 2016/0313642, the contents of which are hereby incorporated by reference. In some embodiments, the dielectric film in the dry film structure has not yet been exposed to a source of radiation or heat to, e.g., form a crosslinked film.

In some embodiments, the dielectric film of the dry film can be delaminated from carrier layer as a self-standing dielectric film. A self-standing dielectric film is a film that can maintain its physical integrity without using any support layer such as a carrier layer. In some embodiments, the self-standing dielectric film can include (e.g., before crosslinking): a) at least one fully imidized polyimide polymer; b) at least one metal-containing (meth)acrylate (e.g., an uncrosslinked metal-containing (meth)acrylate); and c) at least one catalyst (e.g., a catalyst capable of inducing polymerization reaction). In some embodiments, the self-standing dielectric film can be exposed to a source of radiation or heat to form a crosslinked self-standing dielectric film. In some embodiments, the crosslinked self-standing dielectric film can include: a) at least one fully imidized polyimide polymer; and b) at least one crosslinked metal-containing (meth)acrylates. In some embodiments, the self-standing dielectric film (either crosslinked or uncrosslinked) can be laminated to a substrate (e.g., a semiconductor substrate) using a vacuum laminator at about 50° C. to about 140° C. after pre-laminating of the dielectric film with a plane compression method or a hot roll compression method.

In some embodiments, the dielectric film of the dry film structure can be laminated to a substrate (e.g., a semiconductor substrate) using a vacuum laminator at a temperature of about 60° C. to about 140° C. after pre-laminating of the dielectric film of the dry film structure with a plane compression method or a hot roll compression method. When the hot roll lamination is employed, the dry film structure can be placed into a hot roll laminator, the optional protective layer can be peeled away from the dielectric film/carrier substrate, and the dielectric film can be brought into contact with and laminated to a substrate using rollers with heat and pressure to form an article containing the substrate, the dielectric film, and the carrier substrate. The dielectric film can then be exposed to a source of radiation or heat (e.g., through the carrier substrate) to form a crosslinked film. In some embodiments, the carrier substrate can be removed before exposing the dielectric film to a source of radiation or heat.

In some embodiments, a dielectric film is prepared from a dielectric film forming composition of this disclosure by a process containing the steps of:
a) coating the dielectric film forming composition described herein on a substrate to form a dielectric film;
b) optionally baking the film at a temperature from about 50° C. to about 150° C. for about 20 seconds to about 240 seconds; and
c) exposing the dielectric film to a source of radiation or heat.

Coating methods for preparation of the dielectric film include, but are not limited to, spin coating, spray coating, roll coating, rod coating, rotation coating, slit coating, compression coating, curtain coating, die coating, wire bar coating, knife coating and lamination of dry film. Semiconductor substrates could have circular shape such as wafers or could be panels. In some embodiments, semiconductor substrates could be a silicon substrate, a copper substrate, an aluminum substrate, a silicon oxide substrate, a silicon nitride substrate, a glass substrate, an organic substrate, a copper cladded laminate or a dielectric material substrate.

Without wishing to be bound by theory, it is believed that the dielectric film of this disclosure can have a relatively low CTE. In some embodiments, the dielectric film of this disclosure can have a CTE measured at temperature range of 50-150° C. of at most about 100 ppm/° C. (e.g., at most about 95 ppm/° C., at most about 90 ppm/° C., at most about 85 ppm/° C., at most about 80 ppm/° C., at most about 75 ppm/° C., at most about 70 ppm/° C., at most about 65 ppm/° C., at most about 60 ppm/° C., at most about 55 ppm/° C., or at most about 50 ppm/° C.) and at least about 15 ppm/° C. (e.g., at least about 20 ppm/° C., at least about 30 ppm/° C., or at least 40 ppm/° C.).

Film thickness of the dielectric film of this disclosure is not particularly limited. In some embodiments, the dielectric film has a film thickness of at least about 3 microns (e.g., at least about 4 microns, at least about 5 microns, at least about 7 microns, at least about 10 microns, at least about 15 microns, at least about 20 microns, or at least about 25 microns) and/or at most about 100 microns (e.g., at most about 80 microns, at most about 60 microns, at most about 50 microns, at most about 40 microns, or at most about 30 microns).

In some embodiments, the dielectric film can have a relatively small film thickness (e.g., at most about 5 microns, at most about 4 microns, or at most about 3 microns).

The dielectric film then can be exposed to a source of radiation or to heat (e.g., to form a crosslinked film). Non-limiting examples of radiation used for radiation exposure include electron beams, ultraviolet light and X-ray, with ultraviolet light being preferable. Typically, a low-pressure mercury lamp, a high-pressure mercury lamp, an extra-high-pressure mercury lamp, or a halogen lamp can be employed as a radiation source. The exposure dose is not particularly limited and one skilled in the art can easily determine the proper amount. In some embodiments, the exposure dose is at least about 100 mJ/cm² (e.g., at least about 200 mJ/cm², or at least about 500 mJ/cm²) and at most about 2,000 mJ/cm² (e.g., at most about 1,500 mJ/cm² or at most about 1,000 mJ/cm²). If the dielectric film is exposed to heating, the heating temperature is at least about 70° C. (e.g., at least about 100° C., at least about 130° C., or at least about 160° C.) and/or at most about 250° C. (e.g., at most about 220° C., at most about 200° C., or at most about 180° C.). The heating time is at least about 10 minutes (e.g., at least about 20 minutes, at least about 30 minutes, at least about 40 minutes, or at least about 50 minutes) and/or at most about 5 hours (e.g., at most about 4 hours, at most about 3 hours, at most about 2 hours, or at most about 1 hour).

In some embodiments, this disclosure features a process for depositing a metal layer (e.g., to create an embedded copper trace structure) that includes the step of:
a) depositing a dielectric film forming composition of this disclosure on a substrate to form a dielectric film;
b) exposing the dielectric film to a source of radiation or heat;
c) patterning the film (e.g., by a laser ablation process) to form a patterned dielectric film having openings; and
d) depositing a metal (e.g., an electrically conductive metal) into at least one opening in the dielectric film.

Steps a) and b) can be the same as discussed earlier.

Patterned structures described in this disclosure can be obtained by a laser ablation process. Direct laser ablation process with an excimer laser beam is generally a dry, one step material removal to form openings (or patterns) in the dielectric film. In some embodiments, the wavelength of the laser is 351 nm or less (e.g., 351 nm, 308 nm, 248 nm or 193 nm). In some embodiments, the wavelength of laser is 308 nm or less. Examples of suitable laser ablation processes include, but are not limited to, the processes described in U.S. Pat. Nos. 7,598,167, 6,667,551, and 6,114,240, the contents of which are hereby incorporated by reference. Laser ablation processes using conventional dielectric films create large amounts of debris, Removal of this ablation debris often requires additional cleaning process steps by chemical and/or plasma treatment, which adds to the complexity and cost of the process. An important feature of this disclosure is that when the dielectric film prepared from the compositions of this disclosure is patterned by laser ablation process, little or no debris is formed, which results in less process complexity and lower cost. One method of describing the level of debris is by using a scale of 1 to 5, in which 1 represents the least amount of debris (no debris) and 5 represents the highest amount of debris produced by laser ablation process. As illustrated in the Examples below, the debris generated by laser ablation process of the dielectric films prepared from the dielectric film forming compositions of this disclosure is at most 3 (e.g., at most 2 or at most).

Some embodiments of this disclosure describes a process to deposit a metal layer (e.g., an electrically conductive copper layer to create an embedded copper trace structure) on a semiconductor substrate. In some embodiment, to achieve this, a seed layer conformal to the patterned dielectric film is first deposited on the patterned dielectric film (e.g., outside the openings in the film). Seed layer can contain a barrier layer and a metal seeding layer (e.g., a copper seeding layer). An important aspect of the current disclosure is that the barrier layer and metal seeding layer can be deposited on the patterned dielectric film (in or outside of the openings in the film) without the need of using a pretreatment process (e.g., by applying a chemical treatment, applying a plasma treatment, or using an external adhesive layer) to ensure good adhesion between the dielectric film and the seeding layer. In some embodiments, the barrier layer is prepared by using materials capable of preventing diffusion of an electrically conductive metal (e.g., copper) through the dielectric layer. Suitable materials that can be used for the barrier layer include, but are not limited to, tantalum (Ta), titanium (Ti), tantalum nitride (TiN), tungsten nitride (WN), and Ta/TaN. A suitable method of forming the barrier layer is sputtering (e.g., PVD or physical vapor deposition). Sputtering deposition has some advantages as a metal deposition technique because it can be used to deposit many conductive materials, at high deposition rates, with good uniformity and low cost of ownership. Conventional sputtering fill produces relatively poor results for deeper, narrower (high-aspect-ratio) features. The fill factor by sputtering deposition has been improved by collimating the sputtered flux. Typically, this is achieved by inserting between the target and substrate a collimator plate having an array of hexagonal cells.

Next step in the process is metal seeding deposition. A thin metal (e.g., an electrically conductive metal such as copper) seeding layer can be formed on top of the barrier layer in order to improve the deposition of the metal layer (e.g., a copper layer) formed in the succeeding step.

Next step in the process is depositing of an electrically conductive metal layer (e.g., a copper layer) on top of the metal seeding layer in the openings of the patterned dielectric film wherein the metal layer is sufficiently thick to fill the openings in the patterned dielectric film. The metal layer to fill the openings in the patterned dielectric film can be deposited by plating (such as electroless or electrolytic plating), sputtering, plasma vapor deposition (PVD), and chemical vapor deposition (CVD). Electrochemical deposition is generally a preferred method to apply copper since it is more economical than other deposition methods and can flawlessly fill copper into the interconnect features. Copper deposition methods generally should meet the stringent requirements of the semiconductor industry. For example, copper deposits should be uniform and capable of flawlessly filling the small interconnect features of the device, for example, with openings of 100 nm or smaller. This technique has been described, e.g., in U.S. Pat. No. 5,891,804 (Havemann et al.), U.S. Pat. No. 6,399,486 (Tsai et al.), U.S. Pat. No. 7,303,992 (Paneccasio et al.), the contents of which are hereby incorporated by reference.

In some embodiments, the patterned dielectric film includes at least one element having a feature size (e.g., width) of at most about 10 microns (e.g., at most about 9 microns, at most about 8 microns, at most about 7 microns, at most about 6 microns, at most about 5 microns, at most about 4 microns, at most about 3 microns, at most about 2 microns, or at most about 1 micron). One important aspect of this disclosure is that the dielectric films prepared from the dielectric film forming composition described herein are capable of producing patterned with feature size of at most about 3 microns (e.g., at most 2 microns or at most 1 micron) by a laser ablation process.

In some embodiments, the aspect ratio (ratio of height to width) of a feature (e.g., the smallest feature) of the patterned dielectric film of this disclosure is at least about 1/3 (e.g., at least about 1/2, at least about 1/1, at least about 2/1, at least about 3/1, at least about 4/1, or at least about 5/1).

In some embodiments, the process of depositing an electrically conductive metal layer further includes removing overburden of the electrically conductive metal or removing the seed layer (e.g., the barrier layer and the metal seeding layer). A unique aspect of the process of this invention is that the overburden of the electrically conductive metal layer or the seed layer is minimized and can be removed by a relatively simple method, such as wet etching. In some embodiments, the overburden of the electrically conductive metal layer (e.g., a copper layer) is at most about 3 microns (e.g., at most about 2.8 microns, at most about 2.6 microns, at most about 2.4 microns, at most about 2.2 microns, at most about 2.0 microns, or at most about 1.8 microns) and at least about 0.4 micron (e.g., at least about 0.6 micron, at least about 0.8 micron, at least about 1 micron, at least about 1.2 microns, at least about 1.4 microns or at least about 1.6 microns). Examples of copper etchants for removing copper overburden include an aqueous solution containing cupric chloride and hydrochloric acid or an aqueous mixture of ferric nitrate and hydrochloric acid. Examples of other suitable copper etchants include, but are not limited to, the copper etchants described in U.S. Pat. Nos. 4,784,785, 3,361,674, 3,816,306, 5,524,780, 5,650,249, 5,431,776, and 5,248,398, and US application number US2017175274, the contents of which are hereby incorporated by reference.

Additionally, the seed layer (e.g., the barrier layer and the metal seeding layer) can also be removed by wet etching. Examples of suitable titanium etchants for removing a titanium barrier layer include, but are not limited to, hydrofluoric acid and a combination of nitric acid and hydrofluoric acid. Examples of other suitable titanium etchants include, but are not limited to, the titanium etchants described in U.S. Pat. Nos. 4,540,465 and 8,801,958, the contents of which are hereby incorporated by reference. Examples of tantalum etchants for removing a tantalum barrier layer include, but are not limited to, aqueous solutions of sodium hydroxide/hydrogen peroxide and aqueous solutions of potassium hydroxide/hydrogen peroxide.

FIG. 1 is an illustrative scheme showing a conventional process for depositing a conductive metal (e.g., copper) on a patterned dielectric film. In step 100, a conventional dielectric film composition is deposited on a semiconductor substrate. In step 110, the dielectric film is patterned by using a laser ablation process. In step 120, the debris generated during the step 110 is removed (e.g., by chemical treatment using a cleaner or debris remover). A pretreatment process to improve adhesion between a typical dielectric film and seed layer (e.g., including a barrier layer and a seeding layer) is shown in step 130. In order to ensure good adhesion between the dielectric film and seed layer, a pretreatment process involving either a chemical treatment or a plasma treatment or applying an external adhesion promoter is necessary. For example, a desmear process of heating the dielectric film with potassium permanganate and sodium hydroxide solution is generally employed to improve adhesion of the dielectric film with the seed layer. Next, seed layer is deposited in step 140, followed by deposition of an electrically conductive metal in step 150. Chemical mechanical polishing (CMP) is done to remove any overburden of the electrically conductive metal in step 160. Finally, in step 170, a post CMP cleaning is performed to obtain a semiconductor structure having embedded conductive metal traces.

FIG. 2 is an illustrative scheme showing an exemplary inventive process of this disclosure. As shown in FIG. 2, an inventive dielectric film of this disclosure can be formed by depositing a dielectric film forming composition described herein on a semiconductor substrate in step 200. This coated dielectric film can be patterned by a laser ablation process in step 210, which generates little or no debris. A seed layer (e.g., including a barrier layer and a seeding layer) can be deposited directly on dielectric film without any debris removal process or any pretreatment process in step 220, followed by electrically conductive metal (e.g., copper) deposition in step 230. Finally, in step 240, the process can be completed by performing a wet etching process to remove any overburden of the electrically conductive metal or the seed layer to obtain a semiconductor structure having embedded conductive metal traces.

In some embodiments, this disclosure features a three dimensional object containing at least one patterned film formed by a process described herein. In some embodiments, the three dimensional object can include patterned films in at least two stacks (e.g., at least three stacks). Examples of such objects include a semiconductor substrate, a flexible film for electronics, a wire isolation, a wire coating, a wire enamel, or an inked substrate. In some embodiments, this disclosure features semiconductor devices that include one or more of these three dimensional objects. Examples of such semiconductor devices include an integrated circuit, a light emitting diode, a solar cell, and a transistor.

The contents of all publications cited herein (e.g., patents, patent application publications, and articles) are hereby incorporated by reference in their entirety.

The present disclosure is illustrated in more detail with reference to the following examples, which are for illustrative purposes and should not be construed as limiting the scope of the present disclosure.

EXAMPLES

Any percentages listed are by weight (wt %) unless otherwise specified.

Synthesis Example 1

P-1

Preparation of 6FDA/DAPI Polyimide

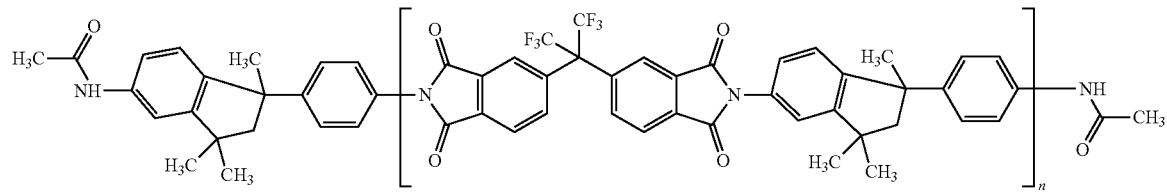

Solid 4,4'-(hexafluoroisopropylidene)bis(phthalic anhydride) (6FDA) (2.370 kg, 5.33 mole) was charged to a solution of 1-(4-aminophenyl)-1,3,3-trimethylindan-5-amine (also known as 4,4'-[1,4-phenylene-bis(1-methylethylidene)]bisaniline (DAPI)) (1.473 kg, 5.51 mole) in NMP (9.86 kg) at 25° C. The reaction temperature was increased to 40° C. and the mixture was allowed to react for 6 hours. Next, acetic anhydride (1.125 kg) and pyridine (0.219 kg) were added and the reaction temperature was increased to 100° C. and allowed to react for 12 hours.

The reaction mixture above was cooled to room temperature and transferred to a larger vessel equipped with a mechanical stirrer. The reaction solution was diluted with ethyl acetate and washed with water for one hour. After the stirring was stopped, the mixture was allowed to stand undisturbed. Once phase separation had occurred, the aqueous phase was removed. The organic phase was diluted with a combination of ethyl acetate and acetone and washed twice with water. The amounts of organic solvents (ethyl acetate and acetone) and water used in all of the washes are shown in Table 1.

TABLE 1

|  | Wash 1 | Wash 2 | Wash 3 |
|---|---|---|---|
| Ethyl Acetate (kg) | 20.5 | 4.1 | 4.1 |
| Acetone (kg) | — | 2.3 | 2.3 |
| Water (kg) | 22.0 | 26.0 | 26.0 |

Cyclopentanone (10.5 kg) was added to the washed organic phase and the solution was concentrated by vacuum distillation to give a polymer solution P-1. The solid % of final polymer was 32.96% and the weight average molecular weight (Mw) measured by GPC was 49,200 Daltons.

General Procedure for Preparation of Dielectric Forming Composition

Dielectric film forming compositions of Examples 1-6 and comparative Example 1 were prepared by mechanically stirring of a mixture of polymer (P-1), appropriate amount of methacryloxypropyl trimethoxysilane, NCI-831 (trade name, available from ADEKA corporation), titanium tetra (carboxyethyl acrylate) (MCA, 60 weight % in n-butanol), silica, cyclohexanone and crosslinkers. After being stirred mechanically for 24 hours, the solution was used without filtration. The compositions of these Examples are shown in Table 2.

TABLE 3

| Example No | Dielectric film forming composition Example Number | Weight % of polyimide and MCA in total solid | | Debris Rating 1 - Best 5 - Worst |
|---|---|---|---|---|
|  |  | Polyimide | MCA |  |
| Example 7 | Example 1 | 24% | 15% | 1 |
| Example 8 | Example 2 | 19% | 12% | 1 |
| Example 9 | Example 3 | 23% | 8% | 2 |
| Example 10 | Example 4 | 27% | 14% | 2 |
| Example 11 | Example 5 | 37% | 15% | 2 |
| Example 12 | Example 6 | 56.39% | 19% | 3 |
| Comparative Example 2 | Comparative Example 1 | 65% | N/A | 5 |

In Examples 7-12, the compositions of Examples 1 to 6 (which all had a fully imidized polyimide polymer and an MCA) generated little or no debris (i.e., with a debris rating of 3 or less) after the laser ablation process. By contrast, in the Comparative Example 2, composition of Comparative Example 1 (which is a conventional dielectric film forming composition without an MCA) generated a significant amount of debris (i.e., with a debris rating of 5) after the laser ablation process.

In Table 3, the amounts of polyimide polymer and MCA were calculated based on the percentages of these two compounds in total solid. The weight of the total solid is defined as the entire weight of a dielectric film forming composition minus the entire weight of the solvent(s) of this composition.

TABLE 2

| Dielectric film forming composition Example Number | Polyimide* (grams) | Crosslinkers (grams) | | | Silica* (grams) | MCA* (grams) | Initiator (grams) | Promoter (grams) | Cyclopentanone (grams) | Cyclohexanone (grams) | n-Butanol (grams) |
|---|---|---|---|---|---|---|---|---|---|---|---|
|  |  | CL-1** | CL-2** | CL-3** |  |  |  |  |  |  |  |
| Example 1 | 9.00 | 21.01 | None | None | None | 5.69 | 0.90 | 1.49 | 18.30 | 39.77 | 3.80 |
| Example 2 | 8.14 | 19.00 | None | None | None | 5.16 | 0.81 | 1.36 | 17.61 | 34.97 | 3.44 |
| Example 3 | 9.00 | 21.00 | None | None | 4.08 | 3.00 | 0.90 | 1.50 | 18.31 | 40.21 | 2.00 |
| Example 4 | 13.50 | 13.50 | 9.45 | 4.05 | None | 6.75 | 0.81 | 1.35 | 29.41 | 16.68 | 4.50 |
| Example 5 | 16.20 | 10.80 | 9.45 | None | None | 6.75 | 0.81 | 1.35 | 35.29 | 16.20 | 4.50 |
| Example 6 | 21.75 | 7.25 | 8.70 | None | None | 7.25 | 0.87 | 1.45 | 47.39 | 0.51 | 4.83 |
| Comparative Example 1 | 21.50 | 7.26 | 2.42 | 2.42 | None | None | 0.65 | 1.08 | 67.06 | None | None |

*Amounts of polyimide polymer, MCA and silica are as 100% solid.
**Crosslinker 1 (CL-1) is CN 992, (trade name available from Arkema-Sartomer), crosslinker 2 (CL-2) is tetraethylene glycol diacrylate, and crosslinker 3 (CL-3) is trimethylolpropane triacrylate General Procedure for Laser Ablation Process Each dielectric film forming composition was spin coated on a silicon wafer and baked at 95° C. for 10 minutes using a hot plate to form a coating. The film was then flood exposed with a broadband UV exposure tool (Carl Süss MA-56) at 500 mJ/cm$^2$ and baked at 170° C. for 2 hours to form a film with a thickness of about 6 to 9 microns. The film was patterned by laser ablation process by using XeCl laser at a wave length of 308 nm at a frequency of 100 Hz. The debris generated by the laser ablation process for each case is shown in Examples 7-12 and Comparative Example 2 in the Table 3.

Example 13

Laser Ablation and Deposition of a Barrier Layer

Laser ablation of dielectric film forming composition of example 2 resulted in a resolution of 2×2 micron (line/space) on a 6.2-micron film (e.g., aspect ratio=6.2/2 or 3.1). Since little or no debris was formed during the laser ablation process, there was no need for a debris removal step or a pretreatment process before the deposition of a barrier layer.

Barrier layer (titanium) was deposited at the top the patterned film using sputtering technique. The deposition was performed using Denton Vacuum Desktop unit at an electric current of 56 mA. A titanium barrier layer having a thickness of 26 nm was formed in 16 minutes.

Example 14

Deposition of Copper Seeding Layer

The copper seeding layer was deposited at the top of the above barrier layer by using the same sputtering tool. A copper seeding layer having a thickness of 420 nm was formed in 60 minutes at an electric current of 50 mA.

Example 15

Deposition of Copper Layer

Electroplating was performed in a plating unit designed for wafers of different sizes. A power source in the form of a rectifier (which converts alternating current electricity to regulated low-voltage DC current) provided the necessary current. Prior to electroplating, the work-piece (wafer) obtained above was cleaned with 10% $H_2SO_4$ followed by deionized water rinse. Electrodes, immersed in the electroplating bath (main ingredients: 3% Methanesulfonic acid and 5% $CuSO_4.5H_2O$ in deionized water as electrolyte), were connected to the output of a DC current source. The wafer to be electroplated acted as negatively charged cathode. The positively charged anode completes the electric circuit. The electroplating bath was maintained at 25° C. while the electrolyte was re-circulated at a rate of 6 gallons per minute. To maintain the uniformity of copper deposition, the cell was designed to have a baffle with proper inserts. Copper was deposited at the rate of one micron per minute when a current of 4.4 amperes and a voltage of 8.8 volts were maintained. The copper overburden was 2 microns.

Example 16

Removal of Copper Overburden and Titanium Barrier Layer

Copper etchant was prepared by first preparing a mixture of 90% deionized water and 10% cupric chloride, followed by adjusting the pH to 1 by addition of hydrochloric acid. The wafer obtained above was immersed in the copper etchant such that 2 microns copper overburden was removed at room temperature after 20 minutes. Titanium etchant was prepared by blending 98.994% deionized water, 1% hydrofluoric acid and 0.006% polyethyleneimine (MW of 200 Daltons). The wafer obtained above was immersed in the titanium etchant such that the barrier layer (26 nm) was removed at room temperature in one minute. A wafer having an embedded copper trace structure was obtained.

Comparative Example 3

Debris Removal

Laser ablation of the dielectric film formed from the composition of Comparative Example 1 resulted in a resolution of 8×8 micron (line/space) on a 11 micron film (e.g., aspect ratio=11/8 or 1.4). A large amount of debris was produced. Therefore, prior to barrier layer deposition, the debris had to be removed. A debris removal composition consisting of 2.5 wt % tetramethyl ammonium hydroxide (TMAH), 7.5 wt % deionized water, 0.5 wt % hydroxylamine sulfate, 4.3 wt % monomethanol amine, 85 wt % tetrahydrofurfuryl alcohol, and 0.2 wt % 5-methyl-1H-benzotriazole was used. This debris removal composition was heated to 60° C. and the wafer was treated by immersing the wafer in the debris removal composition for 5 minutes. The wafer was washed with water and then dried. Debris was completely removed after this treatment.

Comparative Example 4

Deposition of a Barrier Layer

Barrier layer (titanium) was deposited at the top the patterned film of Comparative Example 3 using sputtering technique. The deposition was performed using Denton Vacuum Desktop unit at an electric current of 56 mA. A titanium barrier layer having a thickness of 26 nm was formed in 16 minutes.

Comparative Example 5

Deposition of Copper Seeding Layer

The copper seeding layer was deposited at the top of the above barrier layer by using the same sputtering tool. A copper seeding layer having a thickness of 420 nm was formed in 60 minutes at an electric current of 50 mA.

Comparative Example 6

Deposition of Copper Layer

Electroplating was performed in the same way that was described in Example 15, except for a longer time. The copper overburden was 20 microns.

Comparative Example 7

Removal of Copper Overburden and Titanium Barrier Layer by CMP and Post CMP Cleaning Copper overburden was removed by a CMP process. Copper bulk slurry was used on Mirra AMAT polisher with a slurry flow rate of 175 mL/min. The total time for the CMP process was 10 minutes. Upon completion of this polishing step, the wafer was cleaned in acidic cleaner, which removed organic residues and particles stuck to the surface of the wafer.

Next, the titanium barrier layer was removed by a copper barrier slurry which was more mechanically driven than the bulk slurry, enabling efficient removal of this layer. The wafer was cleaned in a second acidic cleaner, which removed organic residues and particles stuck to the surface of the wafer.

Example 17

Optical Absorbance Measurement of Dielectric Film Forming Composition of Example 1

The dielectric film forming composition of Example 1 was spin coated on top of a transparent 4" glass wafers at thickness of 3.0 um and soft baked at 95° C. for 180 seconds. The Absorbance of this self-standing dry film was measured by using a CARY 400 Conc. UV-Visible Spectrophotometer at a wavelength ranging from 300 to 405 nm. Optical absorbance of this film was 0.383 $\mu m^{-1}$ at 308 nm, 0.125 $\mu m^{-1}$ at 355 nm, 0.127 $\mu m^{-1}$ at 365 nm, and 0.058 $\mu m^{-1}$ at 405 nm.

Example 18

Dielectric Film Forming Composition

Dielectric film forming composition of Example 18 was prepared by using 339.00 g of polymer (P-1), 18.00 g of methacryloxypropyl trimethoxysilane, 10.80 g of OXE-01 (trade name, available from BASF SE), 114.00 g of titanium tetra(carboxyethyl acrylate) (60 weight % in n-butanol), 340.11 g of cyclohexanone, 126.00 g of tetraethylene glycol diacrylate available from Arkema-Sartomer and 252.0 g of urethane acrylate (CN 992, trade name available from Arkema-Sartomer). After being stirred mechanically for 24 hours, the composition was filtered by using a 0.2 micron filter.

Example 19

Dry Film Example 1 (DF-1)

The filtered dielectric film forming composition of Example 18 was applied using a slot die coater from Fujifilm USA (Greenwood, S.C.) with line speed of 2 feet/minutes (60 cm per minutes) with 30 microns microbar clearance onto a polyethylene terephthalate (PET) film (Hostaphan 3915, manufactured by Mitsubishi Polyester Film, Inc.) having a width of 20.2 inches and thickness of 35 microns used as a carrier substrate and dried at 197° F. to obtain a dielectric layer with a thickness of approximately 10.0 microns. On this dielectric layer, a biaxially oriented polypropylene film having a width of 20.2 inches and a thickness of 20 microns (BOPP, manufactured by Mirwec Film Inc., Bloomington, Ind., trade name BOPLON) was laid over by a roll compression to act as a protective layer.

Example 20

Dielectric Film Forming Composition

Dielectric film forming composition of Example 20 was prepared by using 470.98 g of polymer (P-1), 15.00 g of methacryloxypropyl trimethoxysilane, 9.00 g of NCI-831 (trade name, available from ADEKA corporation), 175.00 g of titanium tetra(carboxyethyl acrylate) (60 weight % in n-butanol), 289.04 g of cyclohexanone, 141.00 g of tetraethylene glycol diacrylate available from Arkema-Sartomer, 750 g of 20% silica dispersed in cyclohexanone, and 150.00 g of urethane acrylate (CN 992, trade name available from Arkema-Sartomer). After being stirred mechanically for 24 hours, the solution was used without filtration.

Example 21

Dry Film Example 2 (DF-2)

The unfiltered dielectric film forming composition of Example 20 was applied using a slot die coater from Fujifilm USA (Greenwood, S.C.) with line speed of 2 feet/minutes (60 cm per minutes) with 30 microns microbar clearance onto a polyethylene terephthalate (PET) film (Hostaphan 3915, manufactured by Mitsubishi Polyester Film, Inc.) having a width of 20.2 inches and thickness of 35 microns used as a carrier substrate and dried at 197° F. to obtain a dielectric layer with a thickness of approximately 10.0 microns. On this polymeric layer, a biaxially oriented polypropylene film having a width of 20.2 inches and a thickness of 20 microns (BOPP, manufactured by Mirwec Film Inc., Bloomington, Ind., trade name BOPLON) was laid over by a roll compression to act as a protective layer.

Prophetic Example 22

Dielectric Film Forming Composition

Formulation Example 22 is prepared by using 28.00 g of polymer (Poly-1), 46.88 g of cyclopentanone, 80.00 g of cyclohexanone, 0.84 g of N-(3-trimethoxysilylpropyl) pyrole, 1.40 g of 1-(O-acetyloxime)-1-[9-ethyl-6-(2-methylbenzoyl)-9H-carbazol-3-yl]ethanone (OXE-02, available from BASF), 6.20 g of hafnium tetracarboxyethyl acrylate, 11.00 g of titania with a medium size of 0.45 microns, 14 g of triethylene glycol dimethacrylate, 17.50 g of CN992 (available from Sartomer), 0.84 g of 0.05% solution of Polyfox 6320 in cyclopentanone, and 0.07 g of p-benzoquinone. After being stirred mechanically for 24 hours, the formulation is used without filtration.

Prophetic Example 23

Dielectric Film Forming Composition

Formulation Example 23 is prepared by using 26.00 g of polymer (Poly-1), 47.00 g of cyclopentanone, 75.00 g of cyclohexanone, 0.80 g of N-(3-triethoxysilylpropyl)-4,5-dihydroimidazole, 01.50 g of benzoyl peroxide, 7.50 g of zirconium butoxide tri(meth)acrylate, 17.0 g of tetraethylene glycol Diacrylate (SR-209, available from Sartomer), 14.00 g of pentaerythritol triacrylate, 0.72 g of 0.05% solution of Polyfox 6320 in cyclopentanone, and 0.05 g of p-benzoquinone. After being stirred mechanically for 30 hours, the formulation is used without filtration

What is claimed is:
1. A dielectric film forming composition, comprising:
   a) at least one fully imidized polyimide polymer;
   b) at least one metal-containing (meth)acrylate;
   c) at least one catalyst; and
   d) at least one solvent;
   wherein the at least one metal-containing (meth)acrylate is in an amount of from about 0.5 wt % to about 20 wt % of the composition.
2. The composition of claim 1, wherein the metal atom of the at least one metal-containing (meth)acrylate is selected from the group consisting of titanium, zirconium, hafnium, and germanium.
3. The composition of claim 1, wherein the at least one metal-containing (meth)acrylate comprises at least one metal atom and at least one (meth)acrylate group.
4. The composition of claim 1, wherein the at least one metal-containing (meth)acrylate comprises titanium tetra (meth)acrylate, zirconium tetra(meth)acrylate, hafnium tetra (meth)acrylate, titanium butoxide tri(meth)acrylate, titanium dibutoxide di(meth)acrylate, titanium tributoxide (meth)acrylate, zirconium butoxide tri(meth)acrylate, zirconium dibutoxide di(meth)acrylate, zirconium tributoxide (meth)acrylate, hafnium butoxide tri(meth)acrylate, hafnium dibutoxide di(meth)acrylate, hafnium tributoxide (meth)acrylate, titanium tetra(carboxyethyl (meth)acrylate), zirconium tetra(carboxyethyl (meth)acrylate), hafnium tetra (carboxyethyl (meth)acrylate), titanium butoxide tri(carboxyethyl (meth)acrylate), titanium dibutoxide di(carboxyethyl (meth)acrylate), titanium tributoxide (carboxyethyl (meth)acrylate), zirconium butoxide tri(carboxyethyl (meth) acrylate), zirconium dibutoxide di(carboxyethyl (meth)acrylate), zirconium tributoxide (carboxyethyl (meth)acrylate), hafnium butoxide tri(carboxyethyl (meth)acrylate), hafnium dibutoxide di(carboxyethyl (meth)acrylate), or hafnium tributoxide (carboxyethyl (meth)acrylate).

5. The composition of claim 1, wherein the at least one metal-containing (meth)acrylate is in an amount of from about 1 wt % to about 20 wt % of the composition.

6. The composition of claim 1, wherein the at least one fully imidized polyimide polymer is in an amount of from about 3 wt % to about 40 wt % of the composition.

7. The composition of claim 1, wherein the at least one catalyst comprises a photoinitiator or a thermal initiator.

8. The composition of claim 1, wherein the at least one catalyst is in an amount of from about 0.25 wt % to about 4 wt % of the composition.

9. The composition of claim 1, wherein the at least one solvent is in an amount of from about 35 wt % to about 98 wt % of the composition.

10. The composition of claim 1, further comprising at least one crosslinker.

11. The composition of claim 10, wherein the crosslinker comprises two or more alkenyl or alkynyl groups.

12. The composition of claim 1, further comprising at least one filler.

13. The composition of claim 12, wherein the at least one filler comprise an inorganic particle selected from the group consisting of silica, alumina, titania, zirconia, hafnium oxide, CdSe, CdS, CdTe, CuO, zinc oxide, lanthanum oxide, niobium oxide, tungsten oxide, strontium oxide, calcium titanium oxide, sodium titanate, barium sulfate, barium titanate, barium zirconate, and potassium niobate.

14. The composition of claim 1, wherein the composition forms a dielectric film that generates substantially no debris when the dielectric film is patterned by laser ablation process.

15. A dielectric film formed by the composition of claim 1.

16. A dielectric film, comprising:
a) at least one fully imidized polyimide polymer;
b) at least one metal-containing (meth)acrylates; and
c) at least one catalyst;
wherein the at least one metal-containing (meth)acrylate is in an amount of from about 1 wt % to about 25 wt % of the dielectric film.

17. The dielectric film of claim 16, wherein the dielectric film is a free-standing dielectric film.

18. A process for depositing a conductive metal layer, comprising:
a) depositing the composition of claim 1 on a substrate to form a dielectric film;
b) exposing the dielectric film to a source of radiation or heat;
c) patterning the dielectric film to form a patterned dielectric film having openings;
d) depositing a seed layer on the patterned dielectric film; and
e) depositing a conductive metal layer in at least one opening in the patterned dielectric film.

19. The process of claim 18, further comprising removing overburden of the conductive metal or removing the seed layer.

20. The process of claim 18, wherein removing overburden of the conductive metal or removing the seed layer is performed by wet etching.

21. The process of claim 18, wherein exposing the dielectric film to a source of radiation or heat comprises heating the dielectric film at a temperature from about 70° C. to about 250° C.

22. The process of claim 18, wherein the patterning of the dielectric film is performed by a laser ablation process.

23. The process of claim 22, wherein the laser ablation process results in substantially no debris.

24. The process of claim 18, wherein the patterned dielectric film comprises at least one element having a feature size of at most about 3 microns.

25. The process of claim 18, wherein the conductive metal layer comprises copper.

26. The process of claim 19, wherein the overburden has a thickness of at most about 2 microns.

27. The process of claim 18, wherein the seed layer is deposited without using a debris removal process or a pretreatment process.

28. The process of claim 18, wherein the process is free of a chemical mechanical planarization process or a post chemical mechanical planarization cleaning process for treating a conductive metal overburden.

29. A three dimensional object formed by the process of claim 18.

30. A semiconductor device, comprising the three dimensional object of claim 29.

31. The semiconductor device of claim 30, wherein the semiconductor device is an integrated circuit, a light emitting diode, a solar cell, or a transistor.

32. A process for preparing a dry film structure, comprising:
(A) coating a carrier substrate with a dielectric film forming composition of claim 1 to form a coated composition;
(B) drying the coated composition to form a dielectric film; and
(C) optionally applying a protective layer on the dielectric film.

33. A process for depositing a conductive metal layer, comprising:
a) forming the photosensitive dielectric film of claim 16 on a substrate;
b) exposing the dielectric film to a source of radiation or heat;
c) patterning the dielectric film to form a patterned dielectric film having openings;
d) depositing a seed layer on the patterned dielectric film; and
e) depositing a conductive metal layer in at least one opening in the patterned dielectric film, wherein depositing a conductive metal layer forms a conductive metal overburden having a thickness at most about 2 microns.

34. The process of claim 33, further comprising removing the conductive metal overburden or removing the seed layer.

35. The process of claim 34, wherein removing the conductive metal overburden or removing the seed layer is performed by wet etching.

36. The process of claim 33, wherein exposing the dielectric film to a source of radiation or heat comprises heating the dielectric film at a temperature from about 70° C. to about 250° C.

37. The process of claim 33, wherein the patterning of the dielectric film is performed by a laser ablation process.

38. The process of claim 37, wherein the laser ablation process results in substantially no debris.

39. The process of claim 33, wherein the patterned dielectric film comprises at least one element having a feature size of at most about 3 microns.

40. The process of claim 33, wherein the conductive metal layer comprises copper.

41. The process of claim 33, wherein the seed layer is deposited without using a debris removal process or a pretreatment process.

42. The process of claim 33, wherein the process is free of a chemical mechanical planarization process or a post chemical mechanical planarization cleaning process for treating any conductive metal overburden.

\* \* \* \* \*

UNITED STATES PATENT AND TRADEMARK OFFICE
CERTIFICATE OF CORRECTION

Page 1 of 1

PATENT NO. : 10,875,965 B2
APPLICATION NO. : 15/907323
DATED : December 29, 2020
INVENTOR(S) : Sanjay Malik et al.

It is certified that error appears in the above-identified patent and that said Letters Patent is hereby corrected as shown below:

On the Title Page

Column 1 item (73), (Assignee), Line 2, delete "N," and insert -- N. --

Column 2 item (56), (Other Publications), Line 3, delete "copyrigtht" and insert -- copyright --

In the Claims

Column 28, Line 38, In Claim 33, delete "photosensitive" before "dielectric film"

Signed and Sealed this
Ninth Day of March, 2021

Drew Hirshfeld
*Performing the Functions and Duties of the
Under Secretary of Commerce for Intellectual Property and
Director of the United States Patent and Trademark Office*